United States Patent [19]

Marek

[11] 3,732,482

[45] May 8, 1973

[54] TWO TERMINAL NETWORK WITH NEGATIVE IMPEDANCE

[75] Inventor: Alois Marek, Nussbaumen, Switzerland

[73] Assignee: Brown, Boveri & Company Limited, Baden, Switzerland

[22] Filed: May 30, 1972

[21] Appl. No.: 257,603

Related U.S. Application Data

[62] Division of Ser. No. 122,058, March 8, 1971, abandoned.

[30] Foreign Application Priority Data

Mar. 23, 1970 Switzerland ..........4329/70

[52] U.S. Cl. ..........321/2, 307/304

[51] Int. Cl. ..........H02m 3/22

[58] Field of Search ..........307/304; 321/2, 8

[56] References Cited

UNITED STATES PATENTS

| | | | |
|---|---|---|---|
| 3,369,129 | 2/1968 | Wolterman | 307/304 X |
| 3,473,054 | 10/1969 | Wieczorek | 307/304 X |
| 3,571,630 | 3/1971 | Widlar | 307/304 X |
| 3,601,712 | 8/1971 | Elazar | 307/304 X |
| 3,602,839 | 8/1971 | Williams et al. | 321/2 X |
| 3,670,183 | 6/1972 | Ager et al. | 307/304 |
| 3,678,293 | 7/1972 | Popper | 307/304 X |

*Primary Examiner*—William M. Shoop, Jr.
*Attorney*—W. G. Fasse

[57] ABSTRACT

The present negative impedance two terminal network is embodied by two three terminal amplifiers, for example, one of which is a field effect transistor and the other is a bi-polar transistor, wherein the emitter-collector circuit of the bi-polar transistor and the source-drain circuit of the field effect transistor are connected in series with each other. The two terminals of the network are formed by the base and by the collector of the bi-polar transistor. Said collector is also connected to the gate terminal of the field effect transistor. A control voltage source is preferably connected between said base of the bi-polar transistor and the drain terminal of the field effect transistor, whereby said negative impedance is differentially adjustable by varying the control voltage.

5 Claims, 1 Drawing Figure

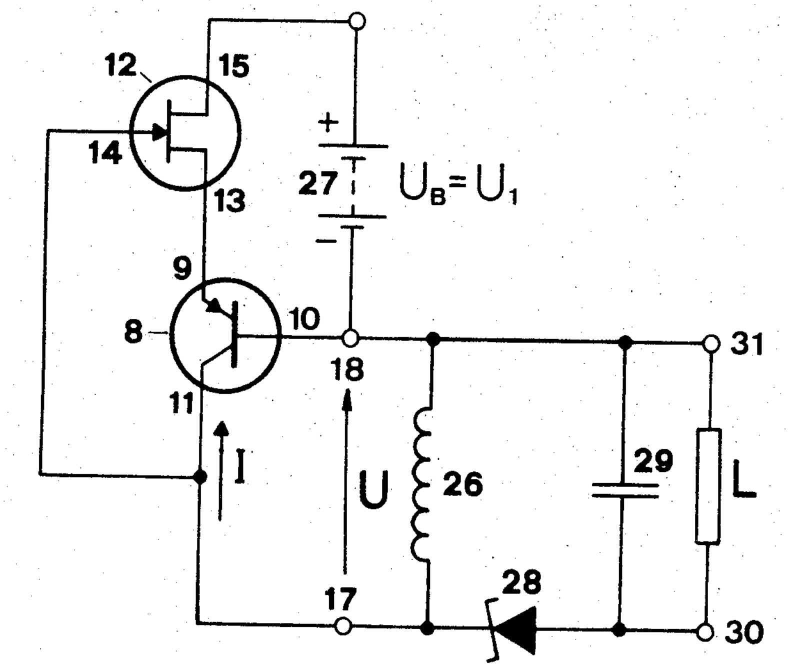
INVENTOR.
ALOIS MAREK
BY
G. G. Fasse
ATTORNEY

TWO TERMINAL NETWORK WITH NEGATIVE IMPEDANCE

This application is a divisional application of my copending application Ser. No. 122,058 filed Mar. 8, 1971, now abandoned.

BACKGROUND OF THE INVENTION

The present invention relates to a two terminal network with a negative impedance, more specifically, with a variable, negative, differential impedance. The invention relates also to a specific embodiment or use of the present two terminal network as the active element in a direct voltage transducer.

Two terminal networks having a negative impedance or resistance, for example, tunnel diodes, four layer diodes, dynatrons and so forth have a wide spread application in electronic circuit arrangements. These two terminal networks are employed, for example, in filters, for reducing the damping in the oscillating circuit of oscillator arrangements, in amplifiers, as well as in pulse and digital circuit arrangements. However, the above mentioned conventional two terminal networks or circuits have a number of drawbacks. Thus, for example, the useful range of the negative resistance or impedance on the voltage current characteristic (U–I-characteristic) is very small. For tunnel diodes said useful range is about 0.5 volts. Quite frequently, the linearity in this range is unsatisfactory and the available voltage level difference is relatively small, for example, it is about 1 volt for GaAs-tunnel diode. Another disadvantage is seen in that the control or adjustment of the value or size of the negative resistance is possible only within narrow limitations or not at all.

Several different equivalent circuits have been suggested heretofore in order to overcome the above mentioned drawbacks. Such circuit arrangements comprise transistors, ohmic resistors and in certain instances additional auxiliary current sources. However, these conventional circuit arrangements display quite similar features in certain ranges of their voltage current characteristics as the above mentioned circuit elements. Thus, a transistor circuit arrangement having the characteristic features of a tunnel diode is described, for example, in "Electronic Engineering 1963, page 751." The same publication describes in 1967 on page 715 a particular application of the circuit arrangement in a transistor oscillator.

These equivalent circuit arrangements permit the variation of the value of the negative resistance only within a certain narrow range, just as the above mentioned circuit elements, for example, the adjustment or variation may be accomplished by varying the operating voltage.

Another conventional circuit arrangement, having the features or behavior of a two terminal network with a negative impedance characteristic, has been described in "Electronics Letters, Volume 6, 1970, No. 1, page 2." Present FIG. 1 illustrates this conventional circuit arrangement, wherein the emitter current of a bi-polar transistor 1 is controlled by means of a field effect transistor 3 which is connected in series with the base terminal 2 of the transistor 1. The working point on the characteristic curve of the field effect transistor 3 is determined in this conventional circuit arrangement by means of the resistors 4 and 5 forming a voltage divider or potentiometer connected between the emitter terminal 6 and the collector terminal 7 of the transistor 1. The resistor 5 determines the value of the negative impedance or resistance. By varying the resistor 5 it is possible to adjust or influence the size of the negative resistance of the two terminal network within a wide range.

The transistor circuit arrangement shown in FIG. 1, however, has a number of drawbacks which pose certain problems for using this circuit in connection with higher frequencies. The resistor 5 or rather one terminal of resistor 5 is connected to the signal voltage. Thus, a change or variation of the resistor 5 by external means causes difficulties. The term "external means" refers to remote control devices which are not located immediately adjacent to the circuit arrangement. Another disadvantage of this conventional circuit arrangement is seen in that it is necessary to provide a capacitive compensation for the potentiometer comprising the resistors 4 and 5. As a result, at least one electrode or terminal of the field effect transistor 3 is supplied by an impedance which again may have a disadvantageous effect on the dynamic voltage current characteristic of the field effect transistor at high frequencies, whereby a failure of the circuit arrangement may be caused.

Another disadvantage is seen in that a small current which is determined by the resistors 4 and 5 of the potentiometer is always flowing in the circuit arrangement according to FIG. 1. This current even varies with the adjustment of the negative resistance.

A still further disadvantage of the conventional circuit arrangement shown in FIG. 1 is seen in that the resistors 4 and 5 of the potentiometer worsen the signal to noise ratio of the two terminal network because these resistors are always connected in parallel to the terminals of the two terminal network.

OBJECTS OF THE INVENTION

In view of the foregoing, it is the aim of the invention to achieve the following objects, either singly or in combination:

to overcome the outlined drawbacks of the prior art;

to provide a two terminal network having an adjustable, negative, differential resistance or impedance, whereby the characteristic features of such network shall not be varied by the circuit elements or means which determine the size of the negative resistance;

to provide a two terminal network with an adjustable, negative, differential resistance and with high frequency characteristics which are determined solely by the active circuit members, that is by the transistors of the circuit arrangement;

to avoid the adjustment of the negative resistance by a voltage carrying a signal voltage component, stated differently, the size of the negative resistance shall be adjustable by a variable dc-voltage which is independent of any signal voltage;

to provide a two terminal circuit arrangement, the frequency limit of which is determined solely by the active elements of the circuit arrangement and not by the circuit means which determine the size of the negative resistance or impedance;

to provide a two terminal circuit arrangement which may be realized with a minimum of circuit elements, whereby the present circuit is very well amenable to its realization in the form of a monolithic circuit or block;

to provide a two terminal network which has a wide range of use, not only for high frequency applications, for example, for tuning the Q-factor of resonance circuits in amplifiers, filters, oscillators, but which may also be useful in connection with digital circuit arrangements and quite generally in connection with the production and shaping of non-sinusoidal alternating voltages or wave forms;

to provide a two terminal network having a differential resistance or impedance which may be varied over a wide range beginning with positive values through an infinite value and into negative values;

to provide a two terminal network which may be used as an energizing two terminal network in oscillator circuit arrangements having an automatic amplitude or gain control;

to provide a two terminal network which is useful as the energizing circuit in a direct voltage transducer operating without a transformer;

to provide a dc-transducer which achieves substantial gain factors and which does not require any additional polarizing voltages; and to provide a two terminal circuit arrangement capable of generating relaxation oscillations in a coil connected to its two terminals.

SUMMARY OF THE INVENTION

The above objects have been achieved according to the invention in a two terminal circuit arrangement comprising a first three terminal amplifier having a given conductivity type and a second three terminal amplifier of an opposite conductivity type, wherein a first channel electrode of the first amplifier and the control electrode of the second amplifier are connected to a common terminal which forms one terminal of said two terminal network, and wherein the second channel electrode of the first amplifier is connected to the first channel electrode of the second amplifier, whereby the control electrode of the first amplifier constitutes the other terminal of the two terminal network. A variable direct voltage source is connected between the control electrode of the first amplifier and the second channel electrode of the second amplifier for varying the negative differential resistance or impedance of the two terminal network.

An advantageous embodiment of the invention comprises a bi-polar transistor constituting said first three terminal amplifier and a field effect or depletion type transistor which constitutes the second three terminal amplifier.

In order to provide a variation of the resistance of the two terminal network within a wide range, the invention teaches to introduce an auxiliary current in the connecting wire between the second channel electrode of the first amplifier and the first channel electrode of the second amplifier.

BRIEF DESCRIPTION OF THE DRAWINGS

In order that the invention may be clearly understood, it will now be described by way of example, with reference to the accompanying drawings, wherein:

FIG. 1 illustrates a conventional two terminal network;

FIG. 2 shows an example two terminal network embodying the present invention;

FIG. 3 illustrates several characteristic curves of the current as a function of the voltage of the two terminal network, whereby three different control voltages are employed as parameter for the circuit diagram of FIG. 2;

FIG. 4 illustrates a modified embodiment of the invention;

FIG. 5 is a characteristic diagram similar to that of FIG. 3 but showing the current voltage characteristic curves for the circuit of FIG. 4;

FIG. 6 illustrates yet another modification of a two terminal network according to the invention as shown in FIG. 2;

FIG. 7 shows the current voltage characteristic curves of the two terminal network according to FIG. 6; and FIG. 8 illustrates a direct voltage transducer according to the invention employing a two terminal network as shown in FIG. 2.

DETAILED DESCRIPTION OF EXAMPLE EMBODIMENTS

FIG. 1 has been described above with reference to the prior art.

In the following description of FIGS. 2, 4, 6, and 8, the same reference numerals will be employed for designating the same elements.

Referring to FIG. 2 there is shown a bi-polar transistor 8 and a field effect transistor 12. The bi-polar transistor 8 has an emitter electrode 9, a base electrode 10, and a collector electrode or terminal 11. The field effect transistor 12 has two channel electrodes constituted by the source terminal 13 and the drain terminal 15. The transistor 12 further has a gate terminal 14. The emitter collector circuit 9, 11 of the bi-polar transistor 8 is connected in series with the channel electrode or terminal circuit 13 and 15 of the field effect transistor 12. Thus, the emitter electrode 9 of the bi-polar transistor 8 is connected to the source terminal 13 of the field effect transistor 12. The collector electrode 11 of the bi-polar transistor 8 is connected to the gate terminal 14 of the field effect transistor 12. A variable voltage source 16 is connected between the base electrode 10 of the bi-polar transistor 8 and the drain terminal 15 of the field effect transistor 12 in such a manner that the positive terminal of the voltage source 16 is connected to said drain terminal 15, whereas its negative terminal is connected to the base electrode 10. The connection lead between the collector terminal 11 of the bi-polar transistor 8 and the gate terminal 14 of the field effect transistor 12 is also connected to a terminal 17 which forms the first terminal of the two terminal network according to the invention. The base electrode 10 of the bi-polar transistor 8 is connected to the second terminal 18 of the two terminal network.

The two terminal network according to FIG. 2 operates as follows, having regard to the voltage current characteristic curves shown in FIG. 3. To simplify the following illustration let it be assumed that the second terminal 18 of the two terminal network is connected to ground.

The voltage source 16 is adjusted so that the drain terminal 15 of the field effect transistor 12 is positive relative to the terminal 18. If now a negative voltage, for example, in the order of about −15 to −30 volts is applied to the terminal 17, the field effect transistor 12 will be non-conducting because its gate terminal 14 is now at a negative potential relative to its source terminal 13. Further, no current can flow through the diode formed by the collector base circuit of the bi-polar transistor 8 because such diode circuit is blocked by the negative voltage applied to the terminal 17. Thus, no current flows in the two terminal network. Even a small voltage increase does not change this state or situation. Accordingly, the differential resistance of the two terminal network is infinite. The respective portion of the voltage current characteristic curves coincides with the abscissa or voltage axis of FIG. 3 and the slope of these curves equals zero.

If now the voltage at terminal 17 is increased so that its values become more positive, the field effect transistor 12 will gradually change to its conducting state and a current can now flow into the emitter electrode 9 of the bi-polar transistor 8 which current appears at the terminal 17 of the two terminal network reduced by the very small base current of transistor 8. The direction of this current is opposite to that shown by the arrow I in FIG. 1.

If now the voltage at the terminal 17 becomes more positive, the current flowing out of terminal 17 increases accordingly, that is the current voltage characteristic curve has in this range a negative rise or slope and the differential resistance is negative as may be seen in FIG. 3. Only when the voltage applied to the terminal 17 becomes actually positive or, stated more presicely, if this voltage exceeds a positive value as determined by the bi-polar transistor 8, the collector base diode of the bi-polar transistor 8 becomes conducting and with increasing voltage at the terminal 17 the current increases also, that is the current indicated by the direction I.

The size of the auxiliary voltage U1 applied to the drain terminal 15 determines for a given voltage at the terminal 17, the conducting or open state of the field effect transistor 12 and thus also the rise or slope of the voltage current characteristic curve. The amount of rise or the gradient is about proportional to the auxiliary or parameter voltage U1 applied between the terminal 18 and the drain terminal 15. Accordingly, the negative differential resistance of the two terminal network is inversely proportional to the auxiliary voltage U1 applied to the drain terminal 15 of the field effect transistor 12.

FIG. 4 illustrates a first modification of the two terminal network as shown in FIG. 2. The circuit of FIG. 4 differs from that of FIG. 2 in that the connecting lead between the emitter electrode 9 of the bi-polar transistor 8 and the source terminal 13 of the field effect transistor 12 is connected to a terminal 19 which in turn is connected to an auxiliary current source 20. The other terminal of the auxiliary current source 20 is connected to the base 10 of the bi-polar transistor 8 and thus to the second output terminal 18 of the two terminal network.

The circuit arrangement of FIG. 4 operates as follows, having regard to the voltage current characteristic curves of FIG. 4. Here again, let it be assumed that the second terminal 18 of the two terminal network is connected to ground potential.

A variable voltage source 16' is connected between the terminal 18 and the drain terminal 15. Initially, this voltage source 16' is adjusted so that the drain terminal 15 of the field effect transistor 12 is positive relative to the terminal 18. Let it further be assumed that the auxiliary current source 20 delivers a current I1 which flows out of terminal 17 in a direction opposite to that indicated by the direction of arrow I. The operation of the circuit arrangement according to FIG. 4 differs from that of FIG. 2 merely in that the voltage current characteristic curves are shifted in the negative current or I-direction by the current amount I1 as shown in FIG. 5. If now the auxiliary voltage U1 is reduced until it reaches zero, the field effect transistor 12 remains blocked or non-conductive because its source drain voltage is disappearingly small. The voltage drop across the emitter base diode of the bi-polar transistor 8 may be disregarded in this connection. The rise or slope of the respective characteristic in FIG. 5 remains zero until the voltage applied to the terminal 17 becomes positive and the collector base diode becomes conducting.

If the auxiliary voltage U1 is permitted to become negative, the field effect transistor 12 will again gradually change into its conducting state, whereby however the field effect transistor 12 now permits a current flow in the opposite direction. The resulting current which is smaller than current I1 flows into the emitter electrode 9 of the bi-polar transistor 8 and, reduced by the base current of transistor 8 it flows out again at the terminal 17 in a direction opposite to that indicated by the direction of arrow I. An increase in the voltage at the terminal 17 results in an increase in the current. Stated differently, the current I becomes less negative. The rise or slope of the voltage current characteristic in FIG. 5 is positive and the differential resistance is also positive. Moreover, this resistance may be controlled as to its value by the auxiliary voltage applied to the drain terminal 15 of the field effect transistor 12.

The surprising advantage of the two terminal network illustrated in the circuit diagram of FIG. 4, is seen in that the differential resistance of the network may be varied within a wide range in accordance with the auxiliary voltage applied to the drain terminal 15 of the field effect transistor 12, whereby the differential resistance may assume negative, infinitely large or positive values, depending upon whether the voltage applied to the drain terminal 15 of the field effect transistor 12 is positive, zero, or negative.

Another embodiment of the invention is illustrated in FIG. 6 comprising a constant current two terminal network in the form, for example, of a second field effect transistor 21, one terminal of which is connected in series with the second channel electrode 15 of the second three terminal amplifier. In this preferred embodiment, the first channel electrode of the second field effect transistor is connected with the second channel electrode of the second three terminal amplifier. The constant current two terminal network is adjustable by means of a second auxiliary voltage produced by an auxiliary voltage source 25 connected between the control electrode 23 and the second channel electrode 24. The constant current two terminal network comprising the second field effect transistor 21 has a conductivity type which is opposite to that of the field effect transistor 12.

Referring specifically to FIG. 6, the drain terminal 15 of the field effect transistor 12 is connected to the drain terminal 22 of said field effect transistor 21, the gate terminal 23 of which is connected to one terminal of said auxiliary voltage source 25, the other terminal of which is connected to the source terminal 24 of the field effect transistor 21. The source 25 provides an auxiliary voltage U2. The variable voltage source 16 is connected with its positive terminal to said source terminal 24 of the field effect transistor 21 while the negative pole of the voltage source 16 is connected to the second terminal 18 of the two terminal network.

The circuit arrangement according to FIG. 6 is especially useful as an energizing or exciter two terminal network in oscillator circuit arrangements having an automatic amplitude or gain control. The function of the circuit according to FIG. 6 will now be described with reference to the voltage current characteristic curves of FIG. 7, whereby it is again assumed that the terminal 18 is connected to ground.

The current flowing through the two terminal network is controlled in such a manner that it cannot exceed a maximum value as determined by the auxiliary voltage U2. This is accomplished by applying said auxiliary voltage U2 to the gate terminal 23 of the field effect transistor 21 in such a manner that the gate terminal 23 is negative relative to the source terminal 24. If the value of the current in the two terminal network and thus also the current through the field effect transistor 12 is smaller than the adjusted maximum current, the voltage drop across the source terminal 24 and the drain terminal 22 of the field effect transistor 21 is small. This means however, that the voltage between the terminal 18 and the drain terminal 15 of the field effect transistor 12 is approximately equal to the auxiliary voltage U1. The result of such voltages U and U1 which cause a current in the two terminal network which flows in a direction opposite to that indicated by the direction of arrow I and which current is between zero and the limit current determined by U2, is a course of characteristic curves which corresponds substantially to that illustrated in FIG. 3. However, if the adjusted limit current is reached then the characteristic curves all run in parallel to the U-axis as shown in FIG. 7.

Referring to FIG. 7, the range of the characteristic curves which is of interest extends to the left of the I-axis. The differential resistance of the two terminal network assumes in this range solely negative or infinitely large values, whereby the auxiliary voltage U1, as explained above, determines the size or value of the differential resistance and the auxiliary voltage U2 determines the maximum current flowing in the direction contrary to that indicated by the direction of arrow I.

An example of utilization of the two terminal network according to FIG. 2 in a direct voltage transducer for voltages larger than or equal to 0.3 volts is illustrated in FIG. 8, wherein a coil or inductance 26 is connected across the first and second terminals 17 and 18 of the two terminal network which produces relaxation oscillations in said coil 26 which oscillations are then rectified by rectifier 28, whereby the input terminals of the transducer are formed by the terminals of the two terminal network to which the auxiliary voltage source is connected, that is, the drain terminal 15 of the field effect transistor 12 and the base terminal 10 of the bi-polar transistor 8 form the input terminals of the direct voltage source.

Referring further to FIG. 8, it will be noted that the rectifier 28 may, for example, be a Zener diode which is connected with its cathode electrode to the first terminal 17 and thus to the coil 26. Between the anode of the Zener diode 28 and the second terminal 18 there is connected a capacitor 29. The two electrodes of the capacitor 29 are connected to two further terminals 30 and 31 forming the output terminals of the transducer. A load L is connected across the output terminals 30 and 31. The battery 27, the voltage of which is to be transduced, is connected with its positive pole to the drain terminal 15 of the field effect transistor 12 and with its negative pole to the second terminal 18.

The direct voltage transducer according to FIG. 8 operates as follows. When the battery voltage UB which corresponds to U1 is applied, a current flows through the field effect transistor 12 and through the emitter collector circuit of the bi-polar transistor 8 into the coil 26. The direction of flow of this current is contrary to that indicated by the direction of arrow I. This current is initially relatively small due to the inductance of the coil 26 and the voltage at the terminal 17 is somewhat positive relative to the terminal 18. At this instance, the voltage corresponds substantially to the positive voltage at which the characteristic curve of the two terminal network intersects the abscissa or U-axis to the right of the ordinate or I-axis in the voltage current characteristic curves. For example, if the bi-polar transistor 8 is a silicone transistor, said voltage is +0.7 volts. In the case the transistor 8 is a germanium transistor, said voltage is +0.3 volts. The current flowing through the coil 26 is negative since the working point of the two terminal network is located in the fourth quadrant of the voltage current characteristic curve diagram as shown in FIG. 3. The value of this current increases gradually, whereby the voltage between the terminals 17 and 18 is decreased. The working point of the two terminal network moves into the range of negative resistance in the voltage current characteristic diagram before said voltage becomes zero, whereby the direction of current increase is suddenly changed.

In view of the foregoing, it will be seen that the voltage reduction between the terminals 17 and 18 produces a voltage across the ends of the coil 26 which exceeds many times the battery voltage UB. Said voltage across the coil 26 tends to maintain the current flow through the coil. The voltage across the coil 26 is negative relative to the terminal 18 and causes a shift of the working point of the two terminal network in the direction of the negative U-axis. Thereafter, the negative current decreases again in its value until it becomes nearly zero because it flows into the load L and into the capacitor 29. As a result, the working point of the two terminal network is shifted into the range of infinitely large resistance and it follows a renewed voltage jump. However, this time in the direction of positive U-values until the voltage or potential between the terminals 17 and 18 is again slightly positive, that is, the terminal 17 becomes positive relative to the terminal 18.

Thereafter, the just described steps are repeated, whereby an alternating voltage is produced at the terminals 17 and 18 which may also be referred to as a relaxation voltage, the peak value of which substantially exceeds the battery voltage.

The Zener diode 28 serves two purposes in the circuit arrangement according to FIG. 8. On the one hand it serves as a rectifying means and on the other hand it stabilizes the output direct voltage by limiting the amplitude of the oscillations occuring across the capacitor 29.

The surprising advantage of the direct voltage transducer according to FIG. 8 as compared to conventional circuit arrangements is seen in that small voltages which are larger or equal to about 0.3 volts can be transduced with good efficiency without the use of an intermediate transformer, whereby the direct voltages at the output exceed the direct input voltage by a factor of 50 to 100. Furthermore, the maximum value of the obtainable output direct voltage is only limited by the breakdown voltages of the semi-conductors employed in the two terminal network. Yet, another advantage is seen in that no extra polarizing voltages are necessary as are definitely required, for example, in connection with comparable transducers employing tunnel diodes.

Incidentally, as explained above with reference to FIG. 3, the gradient or change of the negative slope of the voltage current characteristic curve, and thus the change of the negative differential conductance is nearly or about proportional to the changes of the auxiliary voltage U1 when the latter voltages assume values slightly exceeding the value necessary for making the emitter-base diode of the bi-polar transistor 8 conductive. However, at higher auxiliary voltages U1, the voltage current characteristic curves tend to converge to a common limit. Thus, at high auxiliary voltages U1, the negative differential resistance is non-responsive to even large changes of the auxiliary voltage U1. This characteristic behavior follows as a result of the voltage dependence of the channel current of the field effect transistor 12.

Although specific example embodiments and applications or utilizations of the present invention have been described, it is to be understood that the invention is not limited to such examples. Thus, it is possible to use instead of the field effect transistor 12 in FIGS. 2, 4, and 6 a three terminal amplifier having similar characteristics. The same considerations apply to the field effect transistor 21 of FIG. 6. Similarly, the bi-polar transistor 8 in FIGS. 2, 4, and 6 may be replaced by any other suitable three terminal amplifier network. It is merely essential, that the three terminal amplifier networks 8 and 12 are of respectively opposite conductivity type. Thus, it is to be understood that it is intended to cover all modifications and equivalents within the scope of the appended claims.

What I claim is:

1. An electronic circuit arrangement for converting a given direct voltage into another direct output voltage comprising a direct voltage source for providing said given direct voltage, a first three terminal amplifier of a given conductivity type and having first and second channel electrodes as well as a control electrode, a second three terminal amplifier of an opposite conductivity type relative to said given conductivity type and also having first and seocnd channel electrodes as well as a control electrode, means for connecting said amplifier to form a two terminal network having first and second terminals, means for connecting the first channel electrode of said first amplifier to the control electrode of said second amplifier and to said first terminal of said two terminal network, means for connecting the second channel electrode of said first amplifier to the first channel electrode of said second amplifier, means for connecting the control electrode of said first amplifier to the second terminal of said two terminal network, coil means connected across said first and second terminals of the two terminal network, two output terminals, diode means connected in series between the first terminal of said two terminal network and one of said output terminals, means for connecting the other output terminal to the second terminal of said two terminal network, capacitance means connected across said two output terminals and thus across a series connection including said coil and said diode means, and means for connecting said direct voltage source between the control electrode of said first amplifier and the second channel electrode of said second amplifier.

2. The electronic circuit arrangement according to claim 1 for converting a given positive direct voltage into a negative direct output voltage, wherein said diode means comprise a Zener diode having a cathode connected to the first terminal of said two terminal network and an anode connected to one end of said capacitance means, whereby all polarities are taken relative to the control electrode of said first three terminal amplifier.

3. The electronic circuit arrangement according to claim 1 for converting a given negative direct voltage into a positive direct output voltage, wherein said diode means comprise a Zener diode having an anode connected to the first terminal of said two terminal network and a cathode connected to one end of said capacitance means, whereby all polarities are taken relative to the control electrode of said first three terminal amplifier.

4. The electronic circuit arrangement according to claim 1, wherein said first amplifier is a bi-polar p-n-p transistor having a base, a collector, and an emitter electrode, wherein said second amplifier is a field effect n-channel depletion type transistor having gate, source, and drain terminals, said direct voltage source being connected with its positive pole to said drain terminal of said field effect transistor and with its negative pole to said second terminal of said two terminal network, whereby all polarities are taken relative to the base electrode of said bi-polar p-n-p transistor.

5. The electronic circuit arrangement according to claim 1, wherein said first amplifier is a bi-polar n-p-n transistor having a base, a collector, and an emitter electrode, wherein said second amplifier is a field effect p-channel depletion type transistor having gate, drain and source terminals, said direct voltage source being connected with its negative pole to said drain terminal of said field effect transistor and with its positive pole to said second terminal of said two terminal network, whereby all polarities are taken relative to the base electrode of said bi-polar n-p-n transistor.

* * * * *